United States Patent
Kaehs et al.

(10) Patent No.: US 8,076,774 B2
(45) Date of Patent: Dec. 13, 2011

(54) TRANSISTOR CLAMPING DEVICE

(75) Inventors: Bernhard Kaehs, Unterhaching (DE); Johann Semerad, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 195 days.

(21) Appl. No.: 12/520,653

(22) PCT Filed: Sep. 5, 2007

(86) PCT No.: PCT/EP2007/007748
§ 371 (c)(1), (2), (4) Date: Jul. 14, 2009

(87) PCT Pub. No.: WO2008/083727
PCT Pub. Date: Jul. 17, 2008

(65) Prior Publication Data
US 2010/0079958 A1    Apr. 1, 2010

(30) Foreign Application Priority Data

Dec. 20, 2006 (DE) .................. 10 2006 060 383
Jan. 25, 2007 (DE) .................. 10 2007 003 821

(51) Int. Cl.
*H01L 23/34* (2006.01)
*H01L 21/00* (2006.01)

(52) U.S. Cl. .......................... 257/718; 438/117
(58) Field of Classification Search .......... 257/687, 257/718–722, E23.018–E23.113; 438/117, 438/122
See application file for complete search history.

(56) References Cited

U.S. PATENT DOCUMENTS

| 4,069,497 A | 1/1978 | Steidlitz |
| 5,541,525 A * | 7/1996 | Wood et al. .............. 324/756.02 |
| 6,417,532 B2 * | 7/2002 | Tsunoda et al. .............. 257/219 |
| 7,076,863 B2 * | 7/2006 | Mori et al. .................. 29/748 |
| 2002/0027283 A1 * | 3/2002 | Hiyoshi .................. 257/703 |
| 2006/0138452 A1 * | 6/2006 | Knapp et al. .............. 257/177 |

FOREIGN PATENT DOCUMENTS

| DE | 4123633 A1 | 1/1993 |
| DE | 4327335 A1 | 2/1995 |
| DE | 10237871 A1 | 3/2004 |
| EP | 1024530 A1 | 8/2000 |

OTHER PUBLICATIONS

International Search Report, WO 2008/083727 A1, Dec. 19, 2007, pp. 18-21.
International Preliminary Report on Patentability, PCT/EP2007/007748, Aug. 6, 2009, pp. 1-8.

* cited by examiner

*Primary Examiner* — Calvin Lee
(74) *Attorney, Agent, or Firm* — Ditthavong Mori & Steiner, P.C.; Phouphanomketh Ditthavong

(57) ABSTRACT

A transistor-clamping device for a transistor is provided with a holding block and a spring. The holding block engages over the transistor, so that the spring is pre-tensioned. A pressure plate is provided between the holding block and the transistor. The spring fixes the pressure plate on the transistor, so that a uniform pressure is applied to the transistor via the pressure plate, and, at the side facing away from the pressure plate, the latter accordingly provides a good thermal conduction to a cooling element.

20 Claims, 1 Drawing Sheet

TRANSISTOR CLAMPING DEVICE

CROSS-REFERENCE TO RELATED APPLICATION

The present application is a national phase application of PCT Application No. PCT/EP2007/007748, filed on Sep. 5, 2007, and claims priority to German Patent Application No. 10 2006 060 383.4, filed on Dec. 20, 2006, and German Patent Application No. 10 2007 003 821.8, filed on Jan. 25, 2007, the entire contents of which are herein incorporated by reference.

BACKGROUND OF THE INVENTION

1. Field of the Invention

The invention relates to a clamping device for a transistor.

2. Discussion of the Background

In high-frequency technology, for reasons of shielding, devices and component groups are generally housed in a shielded housing, that is to say, a metallic housing. Power transistors have a high power loss and must therefore be provided with cooling elements of correspondingly large dimensions.

A corresponding electrical component to be cooled is therefore conventionally connected, for example, to a printed circuit board, in such a manner that its cooling surface is disposed in contact with a cooling element projecting from the printed circuit board and, dependent upon the quantity of heat be removed, provided with a different number of variously-shaped individual ribs. The metal flange of the component to be cooled (high-frequency power transistor) projects through a recess in the printed circuit board and lies with its full surface area on a flat milled recess of the cooling plate. The connecting lugs on the transistor are soldered to the connecting surfaces of the printed circuit board. In this context, the cooling plate serves initially to spread the heat. Dependent upon the design of the cooling channels, which are disposed in the cooling plate, the heat loss can be transferred to a cooling fluid or via cooling ribs, which are in thermal contact with the cooling plate, to the air passing through the ribs. The cooling ribs are typically disposed on the side of the cooling element disposed opposite to the power transistors.

According to DE 43 27 335 A1, a clamping device is provided in order to hold a power transistor in an appropriate position in good contact with the internal surface of the housing wall. A component is held in a predetermined position by means of the clamping device, which consists of a spring clasp or a spring clip. Accordingly, it is possible to use the housing wall itself as a cooling element. The rear support is designed in the form of a bridge engaging over the electrical component, and can be attached by means of screws directly to the housing wall at an adequate lateral spacing distance from the electrical component. The particular disadvantage of this clamping device is the spring clasp acting only in a punctate manner, which does not guarantee a uniform distribution of force to the entire electrical component and therefore achieves only a limited quality of thermal transport to the cooling element.

In the case of DE 43 27 335 A1, mains-voltage-operated components are supposed to be pressed in an electrically-insulating manner onto a cooling plate for the removal of heat. In this context, synthetic material is therefore used as the material for insulating from high electrical voltages and not for interrupting an electromagnetically-functioning transformer winding, which is formed from conductive material around the transistor. One major aspect of DE 43 27 335 A1 is to achieve an assembly through the use of the spring with the relatively-thin housing wall, in order to use the latter as a cooling element at the same time as providing an adequate electrical insulation. This does not come into consideration with the use according to the invention because of the large power loss. In the case of DE 43 27 335 A1, the holding device does not also press on the transistor flange. The pressure here is applied exclusively via the spring.

With regard to the stability of the holding block, DE 43 27 335 A1 is uncritical, because only the component to be cooled is pressed flat against the housing wall. In the case of the exemplary embodiment according to the invention, so much force must be applied by the spring, that the comparatively very-broad transistor flange bends in the center so far that a good thermal and also electrical contact is achieved in the center of the component, from where most of the heat must be removed. In this context, the holding block can preferably absorb this entire force as a counter bearing. The technical feasibility with the use of synthetic material as the material for the holding block is possible only through design measures, so that the latter withstands the forces in the long-term. The large stresses on the holding block are minimized according to the invention in such a manner that the use of synthetic material becomes possible in the first place.

One further difference is evident in the preferred design embodiment: in the case of DE 43 27 335 A1, the threads for the attachment screws are disposed in the holding device. With the exemplary embodiment according to the invention, through-boreholes are disposed in the comparable position. The threads are introduced in the solid cooling plate, because the screws must withstand the pressure of the spring.

SUMMARY OF THE INVENTION

Embodiments of the present invention provide a transistor-clamping device, which ensures the removal of heat in an optimal manner and therefore ensures the best possible cooling of the power transistor.

The present invention relates to a transistor-clamping device, in which a holding block engages over the transistor. A spring disposed between the holding block and a pressure plate, preferably a metallic plate spring, is preferably pretensioned by the tightening of, for example, two screws. Accordingly, it presses on the pressure plate disposed between the transistor and the spring, so that the pressure plate is fixed uniformly on the transistor. The pressure uniformly applied via the pressure plate to the transistor determines a good thermal conduction and, additionally, a good electrical earth connection with the cooling element on the side facing away from the pressure plate.

The pressure applied via the pressure plate is distributed so uniformly over the entire transistor surface, that punctate pressure points do not occur and the thermal conduction functions in optimal manner; accordingly, the hard and brittle ceramic cap is not damaged under the high pressure, which could be the case with a punctate pressure, because the cap is hollow in the center.

The plate spring advantageously acts over the entire width of the holding block. A central bending of the holding block is thereby prevented. Bending is preferably prevented in that the ends of the plate spring come to be disposed very close to the screws. By contrast, with the prior art, the pressure is applied via a central screw, which leads to a bending of the block, especially if the latter is made of a synthetic material. The contact of the spring over the width of the holding block prevents any yield or respectively flow behavior of the synthetic material resulting from the high pressure over its operating life.

The plate spring preferably has a rounded edge. The plate spring is disposed in an intermediate space, which is a part of a recess in the holding block. It is clamped between the holding block and the pressure plate. A defined contact pressure is generated via the pre-tensioning of the spring and the spacing distance between the holding block and the pressure plate. A defined tightening torque of the screws is not required in order to generate a defined contact pressure, because this is achieved automatically upon the assembly of the two screws in the holding block.

The pressure plate disposed between the plate spring and transistor advantageously fulfils the function of a clamping element. It is disposed flat on the transistor and is fixed in this position by the pre-tensioned plate spring. The pressure applied by the plate spring is distributed uniformly over the surface of the pressure plate and is transferred to the entire contact surface of the transistor. As a result of the flat distribution of pressure, punctate pressure points, which would cause a significantly-poorer transfer of heat to the cooling element, do not occur. Moreover, local material deformation does not occur. Also, a poor earth connection and the risk of damage to the ceramic of the high-frequency power transistor occurs.

With regard to the transistor, the application of a thermally-conductive paste to the end facing away from the pressure plate is meaningful. The thermally-conductive paste improves the thermal coupling between the transistor and the cooling element to such an extent that the removal of heat takes place with a significantly lower coefficient of thermal conductivity over the entire contact surface. The thermally-conductive paste can also ideally be electrically conductive in order to improve the earth connection. A thermally-conductive foil can also be placed between the transistor flange and the cooling element. However, this must then provide a good electrical conductivity, otherwise the earth connection is interrupted.

The innovative transistor-clamping device, in particular the holding block, is advantageously manufactured from a pressure-resistant and temperature-resistant synthetic material. This influences the electrical and thermal material properties. In particular, the holding block must be designed to be electrically insulating and therefore preferably to be a synthetic material, so that a coil winding does not occur. The heat is not distributed over the entire device, but only localized and removed at the thermally-conductive positions. The warming of the transistor and of the cooling element has no influence on other parts of the device. Accordingly, no part of the device is deformed as a result of thermal stress.

In view of the electrically-insulating properties of the synthetic material, the electromagnetic coupling to the high-frequency power transistor is prevented. The holding block no longer has the possibility of closing an electrical circuit via an electromagnetic coupling to the transistor, which acts like short-circuited transformer winding. Accordingly, resonances, which could disturb the high-frequency properties of the transistor in a sensitive manner, cannot occur.

The pressure resistance of the synthetic material in conjunction with the tensioning of the plate spring is an advantage. The stress on the synthetic material is minimized in that, in the immediate proximity of the screws, the plate spring is in contact over the entire width of the holding block. The holding block, which acts as a counter bearing for the spring, need not therefore transfer the pressure via a long lever, which would cause it to bend and to provide a setting behavior in the long-term. After installation, the plate spring is under constant tension. As a result of the pressure, which it permanently applies to the holding block, it can deform it or even bend it. Preservation of the shape of the holding block is also achieved in the long-term through its pressure resistance. This has an advantageous effect of maintaining the pressure on the pressure plate and, accordingly also the thermal conductivity of the transistor to the cooling element.

The invention is described below with reference to the drawings, which provide a schematic illustration of an advantageous exemplary embodiment of the invention.

DETAILED DESCRIPTION OF EXEMPLARY EMBODIMENTS OF THE INVENTION

Figure 1:
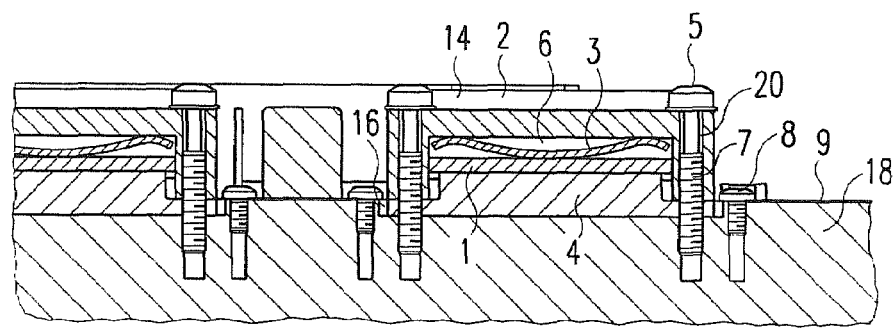
FIG. 1 shows a cross-section of the transistor-clamping device according to the invention.

In FIG. 1, a cross-sectional view was chosen in order to illustrate the internal structure of the transistor-clamping device. The holding block 2, which extends or engages over the entire transistor 4, can be seen as the synthetic-material bridge limited by the screws 5. The holding block 2 covers the remainder of the entire device. The holding block 2 begins at its upper end with the boreholes for the screws 5 and extends downwards. The screws 5, which attach the holding block 2 to the cooling element 18, are guided at the sides outside the recess 6. The guides 20 for the screws 5 are drilled into a rectangular recess 14 on the upper side of the holding block 2, so that, after tightening, the screws 5 disappear completely in the recess 14 in the holding block 2. The recess is preferably formed by two longitudinal webs on the holding block 2, which form this recess 14 and provide stability against bending.

A rectangular recess 6, in which the transistor 4, the pressure plate 1 and the plate spring 3 are arranged, is disposed in the interior of the holding block 2. At the sides, the size of the recess 6 extends almost up to the drilled guides 20 for the screws 5. In the vertical direction, the recess 6 extends from the lower edge up to approximately half the height of the holding block 2. The holding block 2 provides a sufficiently-large intermediate space in the recess 6 for the plate spring 3, which is tensioned in a defined manner within the intermediate space when the screws 5 are fitted.

The plate spring 3 is formed with a curved cross-section and is curved in a U-shape in its central portion. Its lateral edges are curved downwards somewhat in the opposite direction, so that they cannot cut into the holding block 2, when the plate spring 3 is tensioned. The pressure plate 1 is fixed to the underside of the U-shaped portion of the plate spring. The holding block 2 is placed on the plate spring 3 and screwed with the transistor 4 onto the cooling element 18 by means of the screws 5. The plate spring 3 is disposed in an intermediate space, which also accommodates the pressure plate 1, so that the tightening of the screws 5 tensions the plate spring 3 in a defined manner and fixes the pressure plate 1 on the transistor 4.

With regard to its dimensions, the plate spring 3 is approximately the same width as the intermediate space, in which it is disposed. The pressure plate 1 is disposed flat on the transistor 4 and is pressed uniformly by the tensioned plate spring 3 onto the transistor 4. As a result of the distribution of the pressure via the pressure plate 1 onto the transistor 4, a uniform thermal coupling between the transistor 4 and the cooling element 18 is established at the side facing away from the pressure plate 1. In the exemplary embodiment, the pressure plate 1 is of exactly the same width as the transistor 4 disposed beneath it. The thickness of the pressure plate 1 is approximately comparable with the height of the intermediate space, in which the tensioned plate spring 3 is disposed.

The pressure plate 1 is disposed flat on the transistor 4. It is disposed flat on the cooling element 18 in a rectangular recess 16 of the cooling element 18. It does not completely fill the recess 16, but terminates flush with the edges of the holding block 2, so that a small gap is formed in the recess 16 at both sides of the clamping device.

The boreholes are disposed adjacent to the lateral edge of the transistor 4. The screws 5 are screwed through the holding block 2 into the cooling element 18. The thread 7 of the screws 5 extends deep into the cooling element 18, but not down to the drilled depth, so that a small projecting part remains below in the screw boreholes 20.

The height of the transistor in this region corresponds to approximately double the height of the pressure plate 1. The width does not completely correspond to the width of the recess 6 in the holding block 2, so that a hollow cavity remains at the sides, and the pressure plate 2 and plate spring 3 disposed above it project. A thin printed circuit board 9, which is screwed down onto the cooling element 18 with the small screws 8, is mounted laterally adjacent to the device on the cooling element 18.

Figure 2:
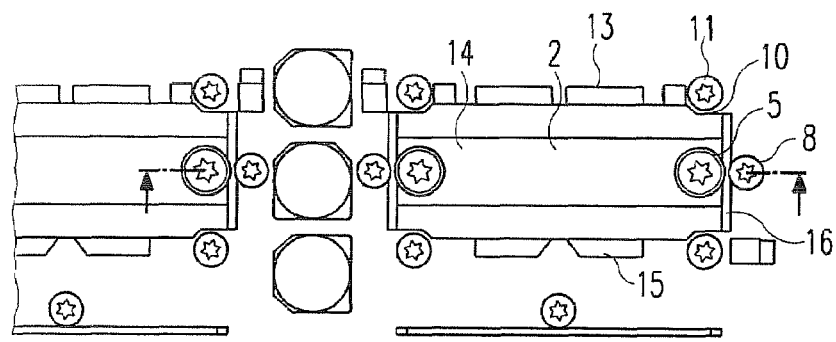
FIG. 2 shows a plan view of the transistor-clamping device according to the invention.

FIG. 2 shows the transistor-clamping device from above. The holding block 2 with the screws 5, which fix the device to the cooling element 18 are visible. The holding block 2 has a rectangular shape and covers almost the entire transistor 4. The recess 14 on the holding block 2 between the screws 5 can also be seen. It is somewhat wider than the screws 5 themselves and extends from the left edge to the right edge. The depth of the recess 14 corresponds almost to the height of a screw head 5.

Recesses 10 are also evident at the corners of the holding block 2. The screws 11, which are screwed into the cooling element 18, are disposed in these recesses 10.

Two rectangular strip lines 13 disposed around the center of the upper edge are the terminals passing to the outside of the transistor 4. At the lower edge in FIG. 2, two strip lines 15, which are also the terminals 15 passing to the outside of the transistor 4, are also disposed around the center of the edge. The side of the strip lines 15 pointing towards the center of the edge is cut away diagonally.

Figure 3:
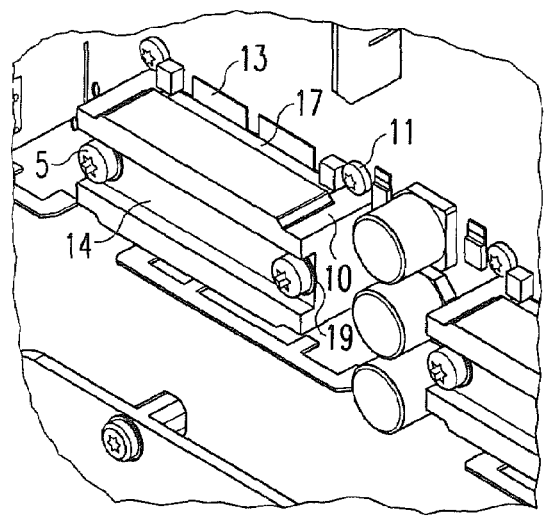
FIG. 3 shows a perspective view of the transistor-clamping device according to the invention.

FIG. 3 shows the transistor-clamping device in a perspective view. The perspective plan view shows the holding block 2 with the screws 5 screwed into the recess 14. It is evident that the screw heads 5 are countersunk in the recess 14 and that they have a washer 19. The recesses 10 extending up to the cooling element 18 are visible at the corners of the holding block 2. Furthermore, it is evident that the lower part of the side is also cut away at the long side of the holding block 2. The strip line connections 13 of the transistor 4 are disposed there.

The holding block according to the invention is preferably designed in such a manner that the latter can be manufactured in a cost-favourable manner with an injection-moulding method. A further addition is provided by a total of four guides, which can be moulded on the sides of the holding block. These modify the recess in such a manner that a type of guide for the spring and the pressure plate is formed within the recess, and accordingly, an automatic centering of the two components during assembly is achieved.

The invention is not restricted to the exemplary embodiment presented. In particular, springs other than a leaf spring or a plate spring can be used. All of the features described and/or illustrated can be combined with one another as required within the framework of the invention.

The invention claimed is:

1. A transistor-clamping device for a transistor, comprising: a holding block and a spring, wherein the holding block engages over the transistor, so that the spring is pre-tensioned, and further wherein:
    a pressure plate is provided between the holding block and the transistor; and
    the spring fixes the pressure plate on the transistor in such a manner that a uniform pressure is applied via the pressure plate to the transistor and the transistor accordingly has a direct thermal conduction to an immediately adjacent cooling element on the side facing away from the pressure plate.

2. The transistor-clamping device according to claim 1, wherein the spring is a metallic plate spring with a curved edge.

3. The transistor-clamping device according to claim 1, wherein the spring applies pressure to the pressure plate over the entire width, so that a central bending is prevented.

4. The transistor-clamping device according to claim 1, wherein the spring is clamped between the holding block and the pressure plate, and wherein a defined, uniform contact pressure is applied via the tensioning of the spring and the spacing distance between the holding block and the pressure plate.

5. The transistor-clamping device according to claim 1, wherein the holding block is made from pressure-resistant and temperature-resistant synthetic material.

6. The transistor-clamping device according to claim 5, wherein the holding block is pre-tensioned against the cooling element via screws.

7. The transistor-clamping device according to claim 1, wherein the holding block is pre-tensioned against the cooling element via screws.

8. The transistor-clamping device according to claim 1, wherein the transistor is a high-frequency power transistor.

9. The transistor-clamping device according to claim 8, wherein the spring applies pressure to the pressure plate over the entire width, so that a central bending is prevented.

10. The transistor-clamping device according to claim 8, wherein the holding block is pre-tensioned against the cooling element via screws.

11. The transistor-clamping device according to claim 8, wherein the spring is clamped between the holding block and the pressure plate, and wherein a defined, uniform contact pressure is applied via the tensioning of the spring and the spacing distance between the holding block and the pressure plate.

12. The transistor-clamping device according to claim 8, wherein the holding block is made from pressure-resistant and temperature-resistant synthetic material.

13. The transistor-clamping device according to claim 8, wherein the spring is a metallic plate spring with a curved edge.

14. The transistor-clamping device according to claim 13, wherein the spring is clamped between the holding block and the pressure plate, and wherein a defined, uniform contact pressure is applied via the tensioning of the spring and the spacing distance between the holding block and the pressure plate.

15. The transistor-clamping device according to claim 13, wherein the holding block is made from pressure-resistant and temperature-resistant synthetic material.

16. The transistor-clamping device according to claim 13, wherein the spring applies pressure to the pressure plate over the entire width, so that a central bending is prevented.

17. The transistor-clamping device according to claim 16, wherein the spring is clamped between the holding block and the pressure plate, and wherein a defined, uniform contact pressure is applied via the tensioning of the spring and the spacing distance between the holding block and the pressure plate.

18. The transistor-clamping device according to claim 17, wherein the holding block is pre-tensioned against the cooling element via screws.

19. The transistor-clamping device according to claim 16, wherein the holding block is pre-tensioned against the cooling element via screws.

20. The transistor-clamping device according to claim 16, wherein the holding block is made from pressure-resistant and temperature-resistant synthetic material.

* * * * *